United States Patent [19]
Rowland et al.

[11] Patent Number: 5,970,313
[45] Date of Patent: Oct. 19, 1999

[54] MONITORING WAFER TEMPERATURE DURING THERMAL PROCESSING OF WAFERS BY MEASURING SHEET RESISTANCE OF A TEST WAFER

[75] Inventors: Daniel V. Rowland, Morgan Hill; Robert A. Huertas, Hollister; Norein Narendra Patel, San Jose, all of Calif.

[73] Assignee: Advanced Micro Devices, Inc., Sunnyvale, Calif.

[21] Appl. No.: 08/994,221

[22] Filed: Dec. 19, 1997

[51] Int. Cl.$^6$ .......................... G01R 31/26; H01L 21/66
[52] U.S. Cl. ................................ 438/17; 324/719
[58] Field of Search .............................. 324/719; 438/14, 438/17, 10

[56] References Cited

U.S. PATENT DOCUMENTS

| | | | |
|---|---|---|---|
| 4,257,825 | 3/1981 | Schaumburg | 438/11 |
| 5,691,648 | 11/1997 | Cheng | 324/716 |

OTHER PUBLICATIONS

*Applications Lab Notes*, by AG Associates, Mar. 17, 1995, pp. 1–20.

*Primary Examiner*—Brian Dutton
*Attorney, Agent, or Firm*—Monica H. Choi

[57] ABSTRACT

A method for monitoring the temperature of a product wafer during thermal processing of the product wafer in an emissivity independent thermal processing system includes processing a test wafer in the emissivity independent thermal processing system that thermally processes the product wafer. The test wafer is pretreated before being thus placed in the thermal processing system. The test wafer is thermally processed following a substantially same thermal processing recipe as that used for thermal processing of the product wafers. After the thermal processing of the test wafer, a sheet resistance of the test wafer is measured. This sheet resistance is correlated to a wafer temperature at the test wafer that was achieved during the thermal processing of the test wafer. Because the product wafer and the test wafer are thermally processed within an emissivity independent thermal processing system, the test wafer temperature is correlated to a product wafer temperature at the product wafer that was achieved during the thermal processing of the product wafer. With such monitoring of the product wafer temperature during actual thermal processing of the product wafer, thermal processing may be more tightly controlled to ensure that a thermal processing recipe is accurately followed.

15 Claims, 3 Drawing Sheets

5,970,313

MONITORING WAFER TEMPERATURE DURING THERMAL PROCESSING OF WAFERS BY MEASURING SHEET RESISTANCE OF A TEST WAFER

TECHNICAL FIELD

This invention relates to thermal processing systems for fabrication of integrated circuits on a wafer, and more particularly to a method for monitoring the temperature of a product wafer during processing of the product wafer by measuring sheet resistance of a test wafer.

BACKGROUND OF THE INVENTION

A thermal processing system which heats up a wafer is a common part of the integrated circuit fabrication process. The wafer may require heating to high temperatures such as 200° Celsius to 1500° Celsius for common processing steps such as annealing or reflow. RTP (Rapid Thermal Processing) systems heat up the wafer to a relatively high temperature within a relatively short period of time, and are prevalently used in integrated circuit fabrication systems.

A thermal processing recipe typically includes a step of heating a product wafer to a specified temperature for a specified time period in accordance with a specified temperature versus time characteristic to achieve a specified result. In order to follow the recipe with precision, the wafer temperature achieved for various temperature settings within a thermal processing system may be monitored.

A common way of monitoring the wafer temperature achieved within the thermal processing system heats up a test wafer and then measures the sheet resistance of the test wafer after the test wafer cools down. This measured sheet resistance is correlated to the test wafer temperature that was achieved during heating of the test wafer. The test wafer is pretreated with a specified process that is known to provide an accurate correlation of sheet resistance (measured after the test wafer has been heated up within the thermal processing system) to the temperature that was achieved at the test wafer during heating of the test wafer within the thermal processing system.

Some prior art thermal processing systems are not emissivity independent meaning that a same wafer temperature is not achieved for two wafers having different prior process histories when those two wafers are thermally processed following a substantially same thermal processing recipe. Thus, in prior art thermal processing systems which are not emissivity independent, a test wafer, which typically has a pretreatment different from the product wafer, cannot accurately reflect the temperature reached at the product wafer.

Accordingly, in the prior art nonemissivity-independent thermal processing system, such a test wafer is used in isolation to monitor the calibration of temperatures achieved within the thermal processing system for various temperature settings. The temperature achieved on a product wafer during actual processing of the product wafer is not determined. However, determination of the temperature achieved on the actual product wafer during thermal processing would allow more accurate control during thermal processing of the product wafer.

More recently, thermal processing system manufacturers are providing thermal processing systems which are emissivity independent such as that available from Applied Materials, Inc, Santa Clara, Calif. Two wafers having different prior process histories achieve substantially same temperatures with substantially same thermal processing recipes within an emissivity independent thermal processing system.

With such an emissivity independent thermal processing system, the temperature achieved at an actual product wafer during processing of the product wafer may be determined from measuring the sheet resistance of a test wafer. Such a determination would allow more accurate control of thermal processing of product wafers.

SUMMARY OF THE INVENTION

Accordingly, a primary object of the present invention is to monitor wafer temperature during processing of a product wafer within a thermal processing system that is emissivity independent.

In a general aspect of the present invention, a test wafer is pretreated to include a pretreatment material. The product wafer and the test wafer then undergo a substantially same thermal processing recipe within a thermal processing system that is emissivity independent. The sheet resistance of the test wafer is measured and correlated to a test wafer temperature achieved during the thermal processing of the test wafer. The test wafer temperature is then correlated to a product wafer temperature achieved during the thermal processing of the product wafer.

The pretreatment material is annealed with the test wafer during the thermal processing of the test wafer. The measured sheet resistance of the test wafer reflects the extent of the pretreatment material annealing with the test wafer. Because the thermal processing system is emissivity independent, the temperature achieved at the test wafer during the processing step is correlated to the temperature achieved at the product wafer during the processing step.

The present invention can be used to particular advantage when the test wafer is pretreated to include a layer of titanium. The layer of titanium preferably has a thickness of 1000 Å. An initial sheet resistance measured on the test wafer after depositing the 1000 Å layer of titanium is preferably 6.3±0.2 Ω/square. A measurement of the initial sheet resistance at a plurality of locations on the test wafer preferably results in a standard deviation that is less than 1% of a mean of the measurement of the initial sheet resistance at the plurality of locations. The test wafer preferably starts as a p-type lightly doped silicon wafer having a bare sheet resistance of 10 Ω/square to 40 Ω/square (before any pretreatment material is included with the test wafer). Moreover, the test wafer is precleaned with a RCA etch and lastly with hydrofluoric acid before depositing the layer of titanium. Each of these pretreatment steps further ensures reliability and repeatability in determining the temperature achieved at the product wafer during the processing step.

In another aspect of the present invention, the test wafer is pretreated with arsenic or boron implantation. In that case, the sheet resistance measured from the annealing of arsenic or boron with the test wafer is correlated to the product wafer temperature achieved during higher processing temperatures of 650° Celsius to 1200° Celsius.

These and other features and advantages of the present invention will be better understood by considering the following detailed description of the invention which is presented with the attached drawings.

BRIEF DESCRIPTION OF THE DRAWINGS

FIG. 5, including

The figures referred to herein are drawn for clarity of illustration and are not necessarily drawn to scale. Moreover, elements having the same reference number in FIGS. 1–5 refer to the same element.

DETAILED DESCRIPTION

Figure 1:
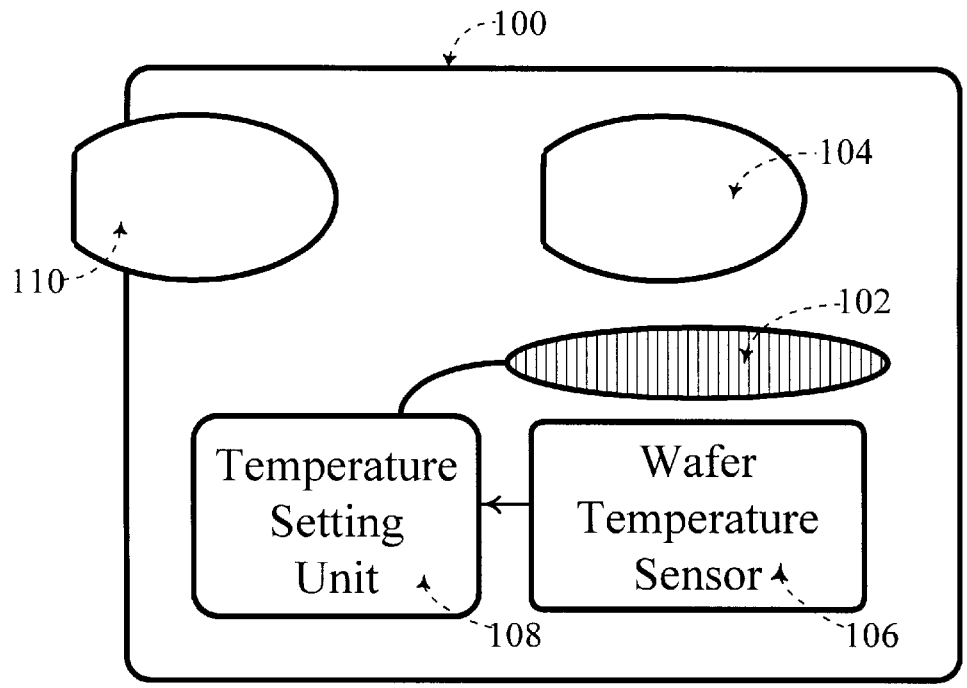
FIG. 1 shows the basic components of an integrated circuit thermal processing system.

Referring to FIG. 1, a thermal processing system 100 includes a heating lamp 102 for heating a face of an integrated circuit wafer. A first wafer 104 is disposed with a face of the first wafer 104 to the heating lamp 102. A wafer temperature sensor 106 detects the temperature achieved at the first wafer 104 during the heating of the first wafer 104 (typically with a pyrometer). The wafer temperature sensor 106 controls a temperature setting unit 108 based on the sensed temperature of the first wafer 104 to in turn control the temperature at the first wafer 104 by feedback.

After the first wafer 104 is thermally processed following a thermal processing recipe, a second wafer 110 may be placed with a face of the second wafer 110 to the heating lamp 102. The second wafer 110 is processed with a substantially similar thermal processing recipe to that used for the first wafer 104. In the prior art thermal processing systems which are not emissivity independent, if the first wafer 104 has a different prior process history from the second wafer 110, then the temperature achieved at the first wafer 104 is different from the temperature achieved at the second wafer 110 even when the two wafers 104 and 110 go through a substantially same thermal processing recipe within the thermal processing system 100. Since the two wafers 104 and 110 have different prior process histories, the wafers 104 and 110 have different physical characteristics with different heat absorption and retention characteristics.

For example, assume that the first wafer 104 is a bare silicon wafer and that the second wafer 110 has a silicon nitride layer deposited on a face that is disposed toward the wafer temperature sensor 106. When these two wafers 104 and 110 are subjected to substantially the same thermal processing recipe within the thermal processing system 100, the temperature achieved at the first wafer 104 is different from that achieved at the second wafer 110 for a thermal processing system that is not emissivity independent.

Figure 2:
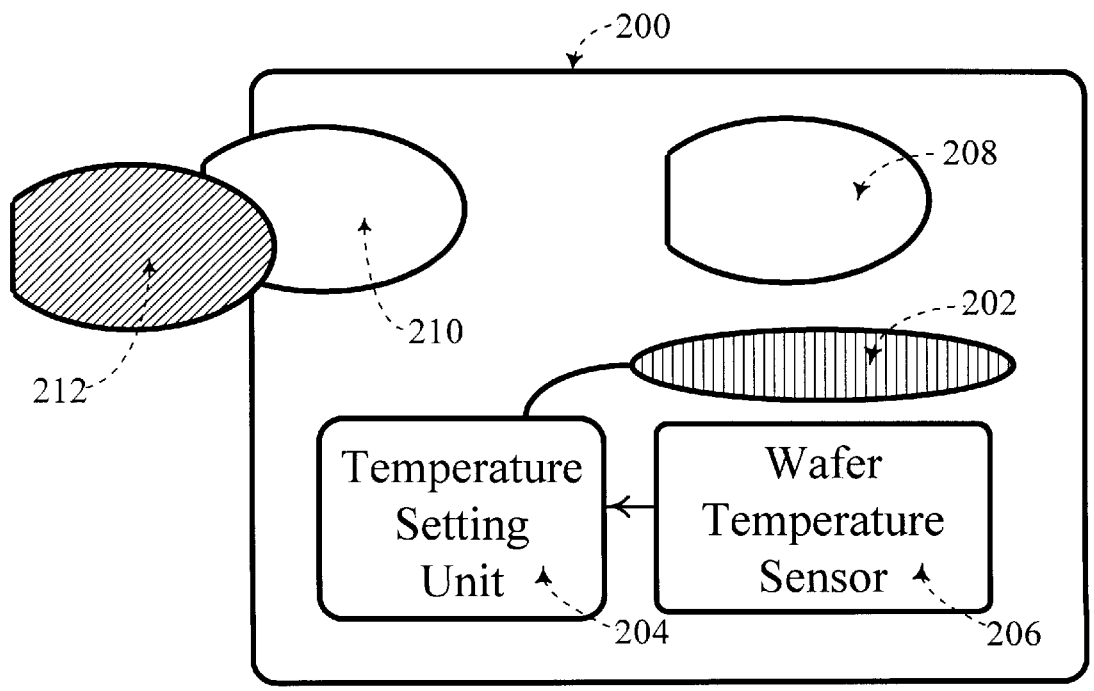
FIG. 2 shows a thermal processing system including a test wafer incorporated into a lot of product wafers, according to a preferred embodiment of the present invention.

Referring to FIG. 2, an emissivity-independent thermal processing system 200, such as that available from Applied Materials, Inc., Santa Clara, Calif. includes a heating lamp 202 coupled to a temperature setting unit 204. A wafer temperature sensor 206 determines the temperature of a wafer being heated by the heating lamp 202 typically by sensing radiation from the wafer being heated. The wafer temperature sensor 206 in turn controls by feedback the temperature setting unit to control the temperature at the wafer being heated based on the determined wafer temperature. In an emissivity-independent thermal processing system, the wafer temperature sensor 206 is sufficiently sensitive to achieve a substantially same temperature for two wafers having different prior process histories.

During thermal processing, a plurality of product wafers (i.e. a "lot" of product wafers) including a first product wafer 208 and a second product wafer 210 are individually disposed near the heating lamp 202 for thermal processing within the thermal processing system 200. Thermal processing includes heating up a product wafer in accordance with a predetermined temperature versus time characteristic for achieving a specified result on the product wafer such as annealing or reflow.

The thermal processing system 200 is emissivity-independent and thus, the temperature characteristic (of temperature versus time) achieved on each of the wafers within the thermal processing system 200 is substantially equal regardless of the respective prior process history of each of the wafers. The present invention monitors the temperature achieved at any of the product wafers by further including a test wafer 212 with the lot of product wafers during thermal processing of the product wafers.

Figure 3:
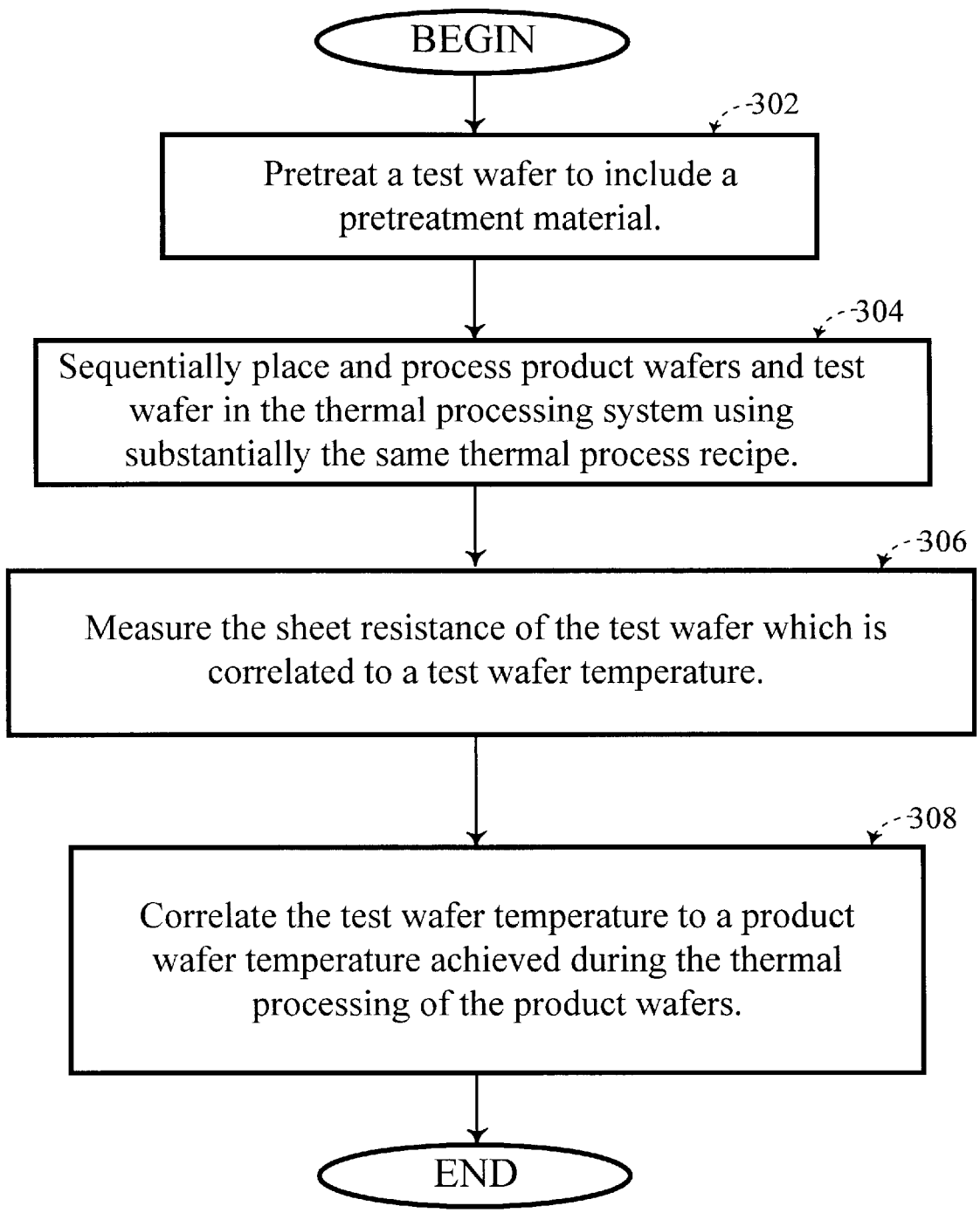
FIG. 3 shows a flowchart of the steps for determining a product wafer temperature from measuring sheet resistance of the test wafer.
Figure 4:
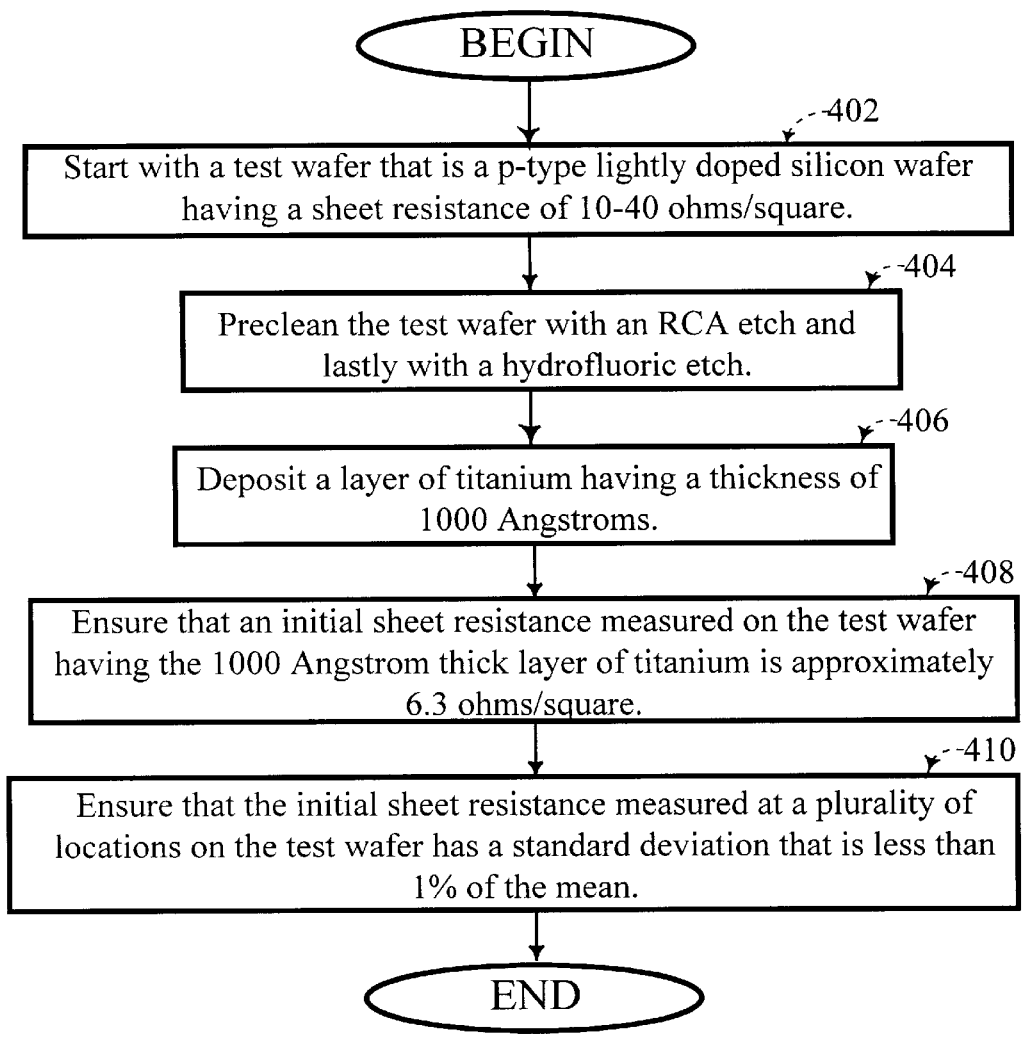
FIG. 4 shows a flowchart of the steps for pretreating the test wafer, according to a preferred embodiment of the present invention.
Figure 5A:
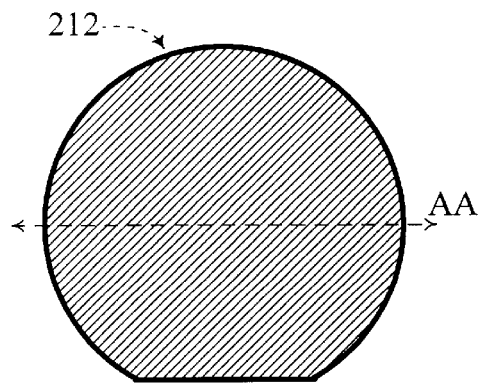
FIG. 5A and FIG. 5B, shows a top view and a cross-sectional view respectively of a test wafer having a pretreatment including a deposition of a layer of titanium.
Figure 5B:
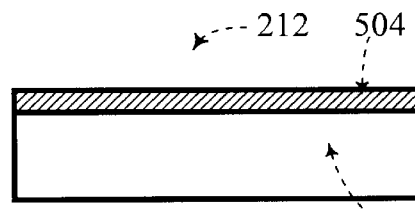

Referring to FIG. 3, the steps of the method of the present invention include pretreating the test wafer 212 to include a pretreatment material (at step 302 of FIG. 3). An example pretreatment process which may result in reliability and repeatability of product wafer temperature determination includes depositing a layer of titanium as the pretreatment material on the test wafer. Referring to FIGS. 4, 5A, and 5B, such a pretreatment process includes starting with a test wafer 212 that is a p-type lightly doped silicon wafer 502 having a sheet resistance of 10 $\Omega$/square to 40 $\Omega$/square (at step 402 of FIG. 4). The test wafer is precleaned with a RCA etch and lastly with a hydrofluoric etch, according to a preferred embodiment of the present invention (at step 404 of FIG. 4). A layer of titanium 504 having a thickness of 1000 Å is deposited on this silicon test wafer 502 (at step 406 of FIG. 4). (Note that FIG. 5B is a cross-sectional view of the test wafer of FIG. 5A along line AA of FIG. 5A.)

An initial sheet resistance measured on the test wafer having the 1000 Å thick layer of titanium is 6.3±0.2 $\Omega$/square (at step 408 of FIG. 4). Furthermore, the initial sheet resistance measured at a plurality of locations on the test wafer has a standard deviation that is less than 1% of the mean of the measurement of the initial sheet resistance at the plurality of locations on the test wafer (at step 410 of FIG. 4). Such initial pretreatment conditions for the test wafer 212 leads to more reliability and repeatability in the determination of the product wafer temperature, according to a preferred embodiment of the present invention.

Referring back to FIGS. 2 and 3, after this pretreatment of the test wafer 212, the test wafer 212 is placed into the emissivity independent thermal processing system 200 (at step 304 of FIG. 3). The test wafer 212 then undergoes thermal processing within the thermal processing system 200 according to a thermal processing recipe for processing the product wafers (at step 304 of FIG. 3).

During the thermal processing of the test wafer 212, the titanium deposited on the test wafer 212 anneals with the silicon test wafer 212. The extent of this annealing of titanium with the silicon test wafer 212 depends on the temperature at the test wafer 212 (and time of anneal) during this thermal processing. The extent of titanium annealing with the silicon test wafer 212 also determines the resulting sheet resistance of the test wafer 212 after the thermal processing of step 304 of FIG. 3.

The sheet resistance of the test wafer 212 is measured after the thermal processing of step 304 of FIG. 3. This measured sheet resistance is then correlated to a test wafer temperature (at step 306 of FIG. 3). This test wafer temperature is the temperature of the test wafer 212 during the thermal processing of step 304 of FIG. 3. Since the thermal processing system 200 is emissivity-independent, the test wafer temperature is correlated to a product wafer temperature (at step 308 of FIG. 3). This product wafer temperature is the temperature of any of the product wafers during the thermal processing of step 304 of FIG. 3. In most emissivity independent thermal processing systems, the test wafer temperature is substantially equal to the product wafer temperature.

In this manner, the product wafer temperature achieved during the thermal processing of the product wafers may be monitored. With such monitoring, the thermal process may be more tightly controlled to ensure that a specified thermal processing recipe is closely followed. A specified thermal processing recipe may require a certain temperature at the product wafers during the thermal processing for best results. The method of the present invention monitors the temperature that was achieved at the lot of product wafers during the actual thermal processing of the product wafers. Appropriate adjustments to the thermal processing system 200 may be made from this monitoring method of the present invention to ensure that a specified thermal processing recipe is tightly followed for any subsequent lots of product wafers.

The foregoing is by way of example only and is not intended to be limiting. For example, the advantageous features of the present invention may be used for thermal processing of any number of product wafers. The configuration of the elements of the thermal processing system 200 of FIG. 2 is by way of example only. For example, the present invention may be practiced with a thermal processing system having two heating lamps each disposed toward a face of a heated wafer. In addition, the steps for pretreating the test wafer 212 of FIG. 4 are by way of example only. The pretreatment step of depositing a layer of titanium on the test wafer is especially amenable for measuring product wafer temperatures that are relatively low including 400° Celsius to 700° Celsius. Other pretreatment steps such as including a step of arsenic or boron implantation may be used. Measuring the extent of annealing of the implanted arsenic or boron is especially amenable for measuring product wafer temperatures that are relatively high including 650° Celsius to 1200° Celsius.

Moreover, it is to be understood that terms and phrases such as "top" and "bottom" used herein refer to the relative location and orientation of various portions of the structures with respect to one another, and are not intended to suggest that any particular absolute orientation with respect to external objects is necessary or required. The invention is limited only as defined in the following claims and equivalents thereof.

We claim:

1. A method for monitoring temperature during processing of a product wafer within a thermal processing system that is emissivity independent, the method including the steps of:
   A. pretreating a test wafer to include a pretreatment material;
   B. placing the test wafer with the product wafer into the thermal processing system to process the product wafer and the test wafer with a substantially same thermal processing recipe within the thermal processing system;
   C. measuring sheet resistance of the test wafer, wherein the sheet resistance of the test wafer is correlated to a test wafer temperature achieved during step B; and
   D. correlating the test wafer temperature to a product wafer temperature achieving during step B.

2. The method of claim 1, wherein the pretreatment material is annealed with the test wafer during step B, and wherein the sheet resistance of the test wafer measured in step C varies with extent of the pretreatment material annealing with the test wafer.

3. The method of claim 1, wherein the pretreatment step A includes the step of:
   depositing a layer of titanium, as the pretreatment material, on the test wafer.

4. The method of claim 3, wherein the layer of titanium has a thickness of 1000 Å.

5. The method of claim 4, wherein an initial sheet resistance measured on the test wafer after depositing the 1000 Å thick layer of titanium is 6.3±0.2 Ω/square.

6. The method of claim 5, wherein a measurement of the initial sheet resistance at a plurality of locations on the test wafer results in a standard deviation that is less than 1% of a mean of the measurement of the initial sheet resistance at the plurality of locations.

7. The method of claim 3, wherein the test wafer starts as a p-type lightly doped silicon wafer having a sheet resistance of 10 Ω/square to 40 Ω/square.

8. The method of claim 3, wherein the test wafer is precleaned before depositing the layer of titanium.

9. The method of claim 8, wherein the test wafer is precleaned with a RCA etch and lastly with hydrofluoric acid.

10. The method of claim 3, wherein the sheet resistance measured in step C, with pretreating the test wafer to include the layer of titanium, is used for correlating to lower product wafer temperatures including 400° Celsius to 700° Celsius.

11. The method of claim 1, wherein the test wafer starts as a p-type lightly doped silicon wafer having a sheet resistance of 10 Ω/square to 40 Ω/square.

12. The method of claim 1, wherein step A includes the step of:
   precleaning the test wafer before including the pretreatment material in the test wafer.

13. The method of claim 1, wherein the pretreatment step A includes the step of:
   implanting one of arsenic and boron, as the pretreatment material, into the test wafer by ion implantation.

14. The method of claim 13, wherein the sheet resistance measured in step C, after pretreating the test wafer to include one of arsenic and boron, is used for correlation to higher product wafer temperatures including 650° Celsius to 1200° Celsius.

15. A method for monitoring temperature during processing of a product wafer within a thermal processing system that is emissivity independent, the method including the steps of:
   A. pretreating a test wafer to include a pretreatment material, step A further including the steps of:
      starting with a test wafer that is a p-type lightly doped silicon wafer having a sheet resistance of 10 Ω/square to 40 Ω/square;
      precleaning the test wafer with a RCA etch and lastly with hydrofluoric acid; and
      depositing a layer of titanium having a thickness of 1000 Å, as the pretreatment material, on the test wafer, wherein an initial sheet resistance measured on the test wafer after depositing the 1000 Å thick layer of titanium is 6.3±0.2 Ω/square, and wherein a measurement of the initial sheet resistance at a plurality of locations on the test wafer results in a standard deviation that is less than 1% of a mean of the measurement of the initial sheet resistance at the plurality of locations;

B. placing the test wafer with the product wafer into the thermal processing system to process the product wafer and the test wafer with a substantially same thermal processing recipe within the thermal processing system;

C. measuring sheet resistance of the test wafer, wherein the sheet resistance of the test wafer is correlated to a test wafer temperature achieved during step B for lower processing temperatures including 400° Celsius to 700° Celsius; and E. correlating the test wafer temperature to a product wafer temperature achieving during step B, and wherein the titanium is annealed with the test wafer during step B, and wherein the sheet resistance of the test wafer measured in step C varies with extent of the titanium annealing with the test wafer.

* * * * *